United States Patent [19]

Huie et al.

[11] Patent Number: 5,091,321
[45] Date of Patent: Feb. 25, 1992

[54] METHOD FOR MAKING AN NPN TRANSISTOR WITH CONTROLLED BASE WIDTH COMPATIBLE WITH MAKING A BI-MOS INTEGRATED CIRCUIT

[75] Inventors: Wing K. Huie, North Wales, Pa.; Alexander H. Owens, Santa Clara, Calif.

[73] Assignee: Allegro Microsystems, Inc., Worcester, Mass.

[21] Appl. No.: 733,919

[22] Filed: Jul. 22, 1991

[51] Int. Cl.$^5$ .................. H01L 21/265; H01L 29/70
[52] U.S. Cl. ........................... 437/27; 437/31; 437/150; 437/961; 148/DIG. 9; 148/DIG. 11
[58] Field of Search ............... 437/31, 27, 150, 961; 148/DIG. 9, 11, DIG. 167, DIG. 10

[56] References Cited

U.S. PATENT DOCUMENTS

| | | | |
|---|---|---|---|
| 3,473,975 | 10/1969 | Cullis | 437/961 |
| 3,649,387 | 3/1972 | Frentz | 437/961 |
| 3,798,084 | 3/1974 | Lyons | 148/DIG. 167 |
| 4,226,650 | 10/1980 | Takahashi et al. | 437/961 |
| 4,622,738 | 11/1986 | Gwozdz et al. | 29/576 B |
| 4,642,883 | 2/1987 | Sakurai et al. | 29/576 B |
| 4,648,909 | 3/1987 | Krishna et al. | 148/1.5 |
| 5,010,026 | 4/1991 | Gomi | 437/31 |

Primary Examiner—Olik Chaudhuri
Assistant Examiner—Long Pham

[57] ABSTRACT

A vertical NPN transistor is fabricated in a silicon integrated circuit substrate growing an N-type epitaxial layer, forming a preliminary P-type base region in the surface of the epitaxial layer, covering the surface with a protective glass layer, selectively etching a hole in the glass layer at an emitter-designated place over the preliminary base region, depositing N-type impurities through the hole into the silicon surface to become the emitter, implanting P-type impurities, of a kind that diffuse faster than the N-type impurities, through the hole into the epitaxial layer and heating to at least anneal the substrate. The hole is then filled to provide electrical contact to the emitter.

7 Claims, 2 Drawing Sheets

METHOD FOR MAKING AN NPN TRANSISTOR WITH CONTROLLED BASE WIDTH COMPATIBLE WITH MAKING A BI-MOS INTEGRATED CIRCUIT

BACKGROUND OF THE INVENTION

This invention relates to a method for making a double diffused vertical NPN transistor with a self aligned emitter to emitter-contact, and more particularly relates to a method employing a second doping step through the emitter-contact-hole for locally deepening the base region under the emitter.

For making bipolar transistors it is known to form a self aligned metal contact to an emitter by diffusing impurities through a hole in an overlying glass layer and filling the hole with contact metal. This has the advantages of self alignment between the emitter and the emitter-contact that makes it possible to reduce the size of the emitter. It also prevents metal contacts subsequently introduced via the hole from doping the silicon surface and making it more positive.

It is often desired to make integrated circuit components in an epitaxial layer of minimum thickness so as to require short doped regions that must run through the epitaxial layer from the surface to the underlying substrate and to buried layers.

By reducing the length of such doped regions, the amount of surface area required by such through-epi-doped regions is reduced. Double-diffused NPN transistors may be made in an N-type epitaxial layer of a minimum thickness that is generally limited by the depth of the base region.

It is an object of this invention to provide a method, for making a double diffused NPN transistor capable of having a small emitter and a thin base region, that is compatible with methods for also making integrated circuits including field effect transistors.

SUMMARY OF THE INVENTION

A method for making a silicon integrated circuit includes first providing a silicon substrate of P-type having an N-type epitaxial layer grown thereon in which an NPN transistor is to be formed. A region of the epitaxial layer is doped with P-type impurities to form a preliminary P-type base region. A blanket layer of a protective glass is formed over the epitaxial layer. The glass layer is selectively etched to create a first hole through the glass layer. N-type impurities are deposited in the epitaxial surface through the first hole to form an emitter. P-type impurities, preferably of a relatively fast-diffusing type, are then implanted through the first hole at an energy level sufficient to penetrate the emitter region. It is preferable that these implanted P-type impurities penetrate substantially all of the preliminary base region. The substrate is subsequently heated to anneal the implanted impurities and to contribute to the establishment of the thickness of the base region between the emitter and the underlying PN junction between the P-type base region and the N-type epitaxial layer. Contact to the emitter is then made by filling the first hole with metal or other conductive material. The combination of the steps for forming a preliminary base region, implanting P-type impurities and heating, forces a portion of the base region that is located directly under said emitter to be deeper than the depth of the base region elsewhere.

Emitters made by this method may be as small as 1.6 u × 1.6 u (where 1 u = 1 micron). Such small emitter dimensions are made possible in this method because the self registration of the conductive contact material with the emitter 40 requires none of the usual allowances of tolerance for misregistration therebetween. The base and emitter of NPN transistors made by the above described preferred method are about 0.35 u deep and 0.2 u deep respectively.

A second important advantage of this method relates to base width control. Without the self registered P-type implant using the emitter contact hole in the glass for extending the base directly under the emitter, control of the base width in such a shallow NPN structure tends to become very difficult, depending as it does upon the difference in implanted and heat diffused depths of the emitter and base.

However, base width control is made increasingly difficult in the case of the self aligned emitter-contact construction because it is virtually impossible to assure etching completely through the glass to form a contact hole and at the same time avoiding etching away some of the underlying epitaxial silicon. The self aligned supplementary P-type base implant through the implanted emitter region, whereby the emitter impurities and the supplementary P-type base impurities are introduced precisely into the same silicon surface area, eliminates the glass-etching step as a base width determining factor.

DESCRIPTION OF THE PREFERRED EMBODIMENTS

Figure 1:
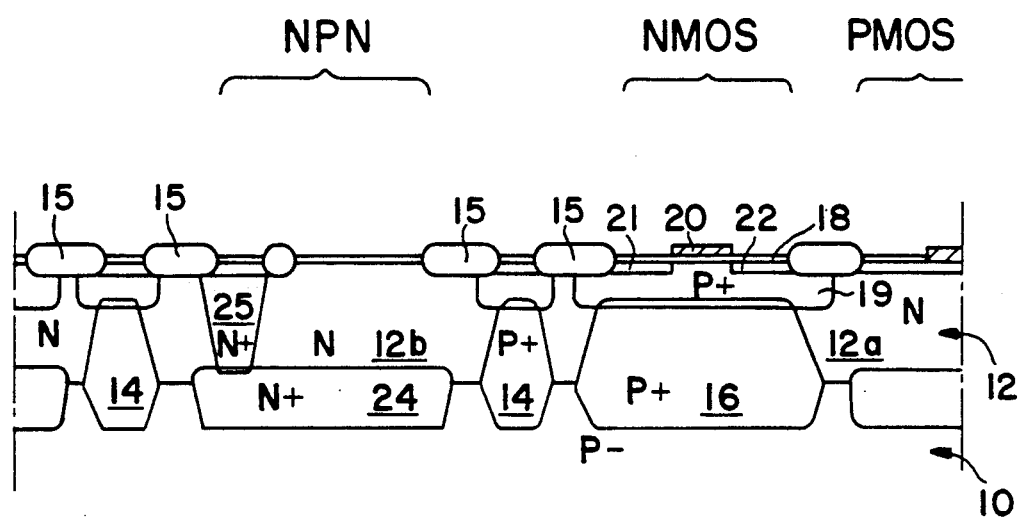
FIG. 1 shows in cross sectional view a portion of an integrated circuit of this invention at an intermediate stage of manufacture.

There is first made a partially developed integrated circuit as is illustrated in FIG. 1. It is formed in a lightly P-doped substrate 10 on which an N-type epitaxial layer 12 has been grown. A first pocket portion 12a of the epitaxial layer is surrounded and defined by part of a network of P-type isolation walls 14 and is the site at which an N-channel MOS transistor is to be formed. A buried P-type layer 16 and a buried N-type layer 24 are formed at the interface between the substrate 10 and the epitaxial layer 12. A P-well 19 is formed in pocket 12a over and overlapping with the P-type buried layer 16. An oxide layer 18 is grown over the surface of the epitaxial layer 12.

A field oxide layer 15 is formed at several thousand angstroms thick using a nitride device-area mask (not shown) as in the conventional "LOCOS" process leaving openings at which devices are to be formed. A polysilicon gate 20 is formed over the oxide 18. Phosphorous atoms are introduced into the epitaxial surface on opposite sides of the already formed gate 20 for making source 21 and drain 22 that are self-aligned with the gate.

Another epitaxial pocket 12b includes an N-type buried layer 24 and an N+ plug 25, and is to become the site of a vertical NPN transistor. A P-type base region 30 is also provided in pocket 12b. A P+ base-contact region 32 is formed in a surface portion of the base region 30.

Figure 2:
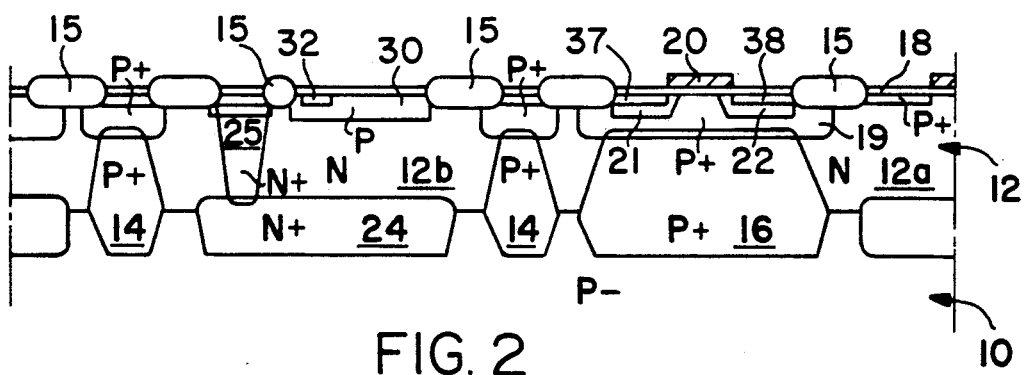
FIG. 2 shows in cross sectional view the integrated circuit of FIG. 1 at a next stage in manufacture.

At this point in the manufacturing process the integrated circuit has been partially developed to the state illustrated in FIG. 2. The briefly described thus-far developed integrated circuit may be made by the more detailed process steps described in the U.S. Pat. No. 5,001,073 to W. Huie.

In the next step, a thick blanket layer 34 of a boron phosphorous silicate glass of about 8000 Å thickness is formed over the oxide layer 18 by a standard chemical vapor deposition step followed by a standard glass-reflow heating step. This glass is often used for its good electrical insulating and passivation properties and can be reflowed by heating at about 900° C. to obtain a planar surface. This heating partially drives the base region 30 and the P+ region 32. Other such glasses consist simply of a phosphorous doped silica.

Figure 3:
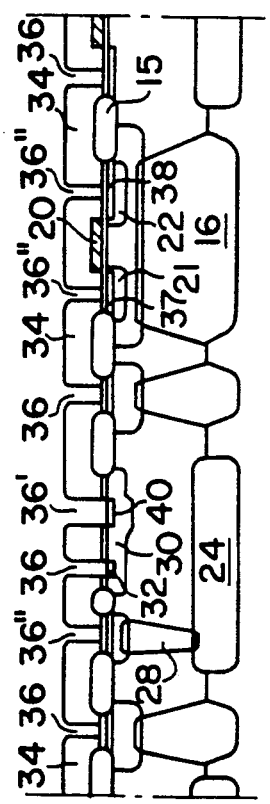
FIG. 3 shows in cross sectional view the integrated circuit of FIG. 2 after further development including a blanket layer of glass through which metal contacts have been made.

A photoresist etch-mask (not shown) is then formed over the glass layer 34, through which holes 36, 36' and 36" are etched completely through the glass layer 34 and further through oxide layer 18. Thus access is provided to the surface of the epitaxial layer at those surface areas at which ohmic contact is wanted as is illustrated in FIG. 3. One of the holes 36' exposes a central area of base region 30 where an emitter is to be formed.

After removing the etch-mask another photoresist mask (now shown) is formed over the glass layer 34. That another mask covers the holes 36 wherein contacts to P-type regions are to be made such as the hole 36 situated over the P+ base contact region 32, while leaving open the hole 36' that leads to the base 30 and holes 36" that lead to source 21, drain 22 and to other N-type regions, e.g. N+ plug 28.

Subsequently, $1 \times 10^{16}$ arsenic atoms are implanted at 100 Kev through the open holes 36' to form the emitter 40 in an inner part of the base 30, and through holes 36" to simultaneously form the core-contact regions 37 and 38 in inner parts respectively of the source 21 and drain 22. The deeper diffused phosphorous regions 21 and 22, respectively, form graded junctions with the shallower and higher concentration arsenic regions 37 and 38. The resulting structure is illustrated in FIG. 3.

There are then implanted P-type impurities, preferably boron at 70 Kev to obtain a concentration of these implanted boron atoms at about $4 \times 10^{12}/cm^3$, through the still open holes 36' and 36" in the glass layer 15, for penetrating substantially through the arsenic implanted emitter 40. This boron implantation step, after a heating and impurities-driving step described below, has the effect of controllably determining the base width of the NPN transistor since the base-collector junction (at the region directly below the emitter) is no longer a function of the etching step in which the hole 36' is formed in the glass layer 15 and in which some uncontrolled amount of the underlying epitaxial silicon is inevitably removed.

Figure 4:
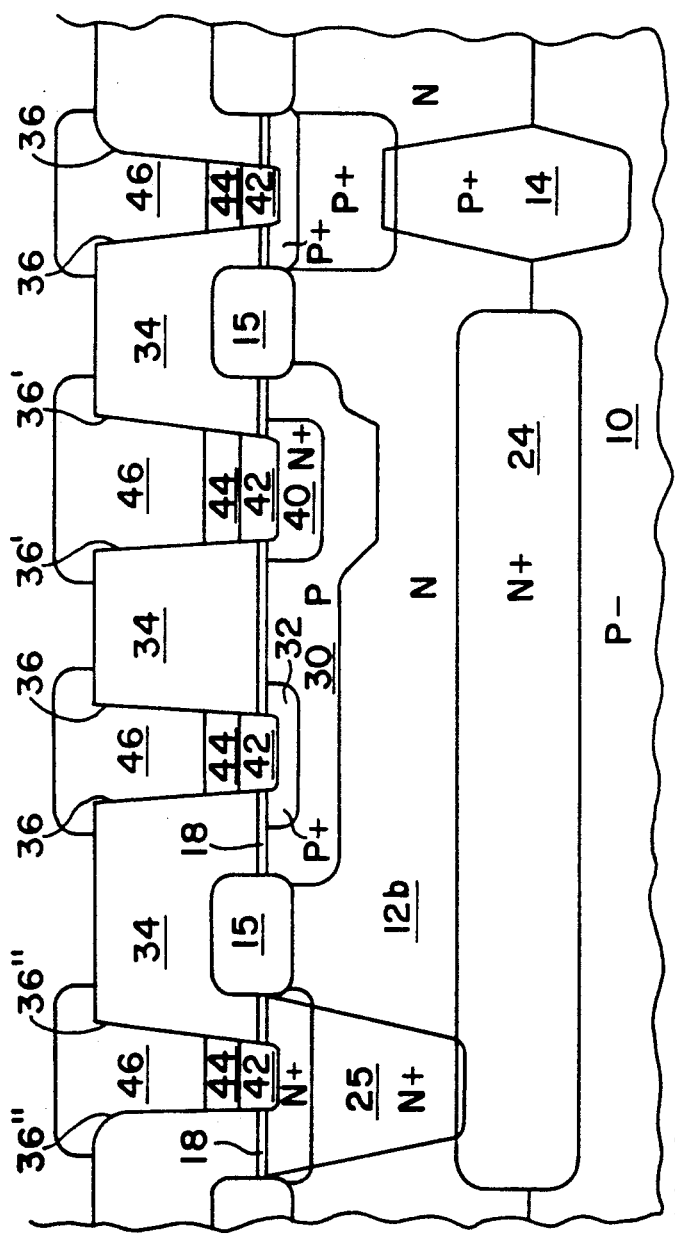
FIG. 4 shows in cross sectional view a magnified detail of the portion of the integrated circuit of FIG. 2 that includes the fully developed NPN transistor.

In the following step, as illustrated in FIG. 4, titanium is sputtered to form a blanket titanium layer (not shown) of about 500 Å thickness over the glass layer 34 and over the epitaxial areas exposed by the holes 36, 36' and 36" in the glass layer 34. Then by a standard anneal or alloying step, effected by heating in nitrogen at about 670° C., the titanium in the holes through the glass-layer is alloyed with the underlying silicon. In a subsequent stripping in sulfuric acid removal of the titanium overlying the glass layer 34 is effected and the $TiSi_2$ alloy 42 remains in the holes 36, 36' and 36".

Two blanket layers (not shown) of titanium-tungsten (TiW) and aluminum, and then of aluminum-silicon-copper (AlSiCu), respectively, are sequentially deposited by sputtering and similarly selectively removed to leave a TiW layer 44 with an overlying AlSiCu layer 46 in each hole 36, 36' and 36", so as to complete the compound metal contacts to the emitter 40, to the source 22 and drain 24 and to all other contact areas. The TiW layer 44 serves as a barrier metal to prevent the aluminum from spiking into the silicon that may result in an electrical short to the shallow junctions, e.g. through the shallow emitter 40. Alloying at the interfaces of the three contact layers 42, 44 and 46 is subsequently accomplished by heating at 450° C.

WHAT IS CLAIMED IS:

1. A method for making a silicon integrated circuit comprising:
   providing a P-type silicon substrate having an N-type epitaxial layer grown thereon and defining an NPN region of said epitaxial layer in which an NPN transistor is to be formed;
   selectively doping with P-type atoms a portion of said epitaxial NPN region to provide a preliminary P-type base region at the epitaxial surface of said NPN region;
   forming a blanket layer of a protective glass over said epitaxial layer;
   selectively etching a first hole through said glass layer to expose said epitaxial surface at an emitter-designated portion of said P-type base region;
   depositing N-type impurities through said first hole into the surface of said epitaxial layer to form an N-type emitter in said P-type base region;
   implanting P-type impurities through said first hole to penetrate substantially all of said base region, to increase locally near said emitter the concentration of P-type impurities in said base region; and
   heating to drive said P-type and N-type impurities for obtaining a controlled base width in said NPN transistor.

2. The method of claim 1 wherein the combination of said steps for selectively doping P-type impurities, implanting P-type impurities and heating are for establishing a portion of said base region, which is located directly under said emitter, at a depth greater than that of said base region elsewhere.

3. The method of claim 1 wherein said deposited N-type impurities are of a slower diffusing type than are said implanted P-type impurities so that the base width of said NPN transistor increases during said heating to drive said P-type and N-type impurities.

4. The method of claim 1 wherein said implanting P-type impurities is at a sufficiently high energy level to penetrate substantially all of said base region.

5. The method of claim 1, additionally comprising after said heating, forming a conductive contact in said hole to said emitter.

6. The method of claim 1 additionally comprising defining a separate NMOS region of said epitaxial layer in which an NMOS transistor is to be formed, growing a silicon oxide film over said NMOS region, forming a conductive gate over a portion of said film and NMOS region, and forming a source and drain region on opposing sides of said gate by selectively diffusing N-type atoms into said epitaxial layer,
wherein said selectively etching additionally includes etching a second and third hole through said glass layer to expose said epitaxial surface over said source and drain region, and said depositing N-type impurities includes depositing N-type impurities through said second and third holes to form a core contact region in each of said source and drain regions.

7. The method of claim 1 additionally comprising after said heating, forming a conductive contact in said first, second and third holes.

* * * * *